United States Patent
Li et al.

(10) Patent No.: US 7,313,023 B2
(45) Date of Patent: Dec. 25, 2007

(54) PARTITION OF NON-VOLATILE MEMORY ARRAY TO REDUCE BIT LINE CAPACITANCE

(75) Inventors: Yan Li, Milpitas, CA (US); Farookh Moogat, Fremont, CA (US)

(73) Assignee: SanDisk Corporation, Milpitas, CA (US)

( * ) Notice: Subject to any disclaimer, the term of this patent is extended or adjusted under 35 U.S.C. 154(b) by 0 days.

(21) Appl. No.: 11/078,173

(22) Filed: Mar. 11, 2005

(65) Prior Publication Data

US 2006/0203587 A1    Sep. 14, 2006

(51) Int. Cl.
G11C 7/18 (2006.01)
G11C 8/12 (2006.01)
G11C 7/02 (2006.01)

(52) U.S. Cl. .................. 365/185.13; 365/230.03; 365/207

(58) Field of Classification Search .............. 365/207, 365/185.06, 185.11, 185.13, 230.03, 230.04, 365/185.17, 185.05, 63, 72
See application file for complete search history.

(56) References Cited

U.S. PATENT DOCUMENTS

| | | | |
|---|---|---|---|
| 4,658,377 A | 4/1987 | McElroy | |
| 5,023,837 A | 6/1991 | Schreck et al. | |
| 5,313,432 A | 5/1994 | Lin et al. | |
| 5,315,541 A * | 5/1994 | Harari et al. | 365/185.13 |
| 5,449,633 A | 9/1995 | Bergemont | |
| 5,677,867 A | 10/1997 | Hazani | |
| 5,712,180 A | 1/1998 | Guterman et al. | |
| 5,892,724 A * | 4/1999 | Hasegawa et al. | 365/230.03 |
| 5,943,284 A | 8/1999 | Mizuno et al. | |
| 6,091,633 A | 7/2000 | Cernea et al. | |
| 6,169,697 B1 | 1/2001 | Shin | |
| 6,262,914 B1 | 7/2001 | Smayling et al. | |
| 6,284,585 B1 | 9/2001 | Camerlenghi et al. | |
| 6,335,874 B1 | 1/2002 | Eitan | |
| 6,442,099 B1 | 8/2002 | Kant et al. | |
| 6,465,818 B1 * | 10/2002 | Kato | 257/207 |
| 6,507,515 B2 * | 1/2003 | Taniguchi | 365/185.17 |
| 6,532,172 B2 | 3/2003 | Harari et al. | |
| 6,552,932 B1 | 4/2003 | Cernea | |
| 6,621,733 B2 | 9/2003 | Chiu | |
| 7,046,542 B2 * | 5/2006 | Shuto | 365/145 |

(Continued)

OTHER PUBLICATIONS

Notification of Transmittal of the International Search Report and the Written Opinion of the International Searching Authority, or the Declaration for International Application No. PCT/US2006/008410, for SanDisk Corporation mailed Jun. 13, 2006.

*Primary Examiner*—Richard T. Elms
*Assistant Examiner*—Douglas S King
(74) *Attorney, Agent, or Firm*—Davis Wright Tremaine LLP

(57) ABSTRACT

The present invention that partitions a memory array in N segments by switchably partitioning the bit lines in the array. In the exemplary embodiment, a top set of sense amps control the even bit lines and a bottom set of sense amps control the odd bit lines. The segmentation transistors turn on or off depending on the selected word line location in the array. Since bit line capacitance is mainly from the metal bit line to bit line coupling to their immediate neighbors, the bit line neighbors in the partitioned array are floating in some segments of the bit lines. The overall bit line capacitance is significantly reduced with a negligible increase in die size, resulting in reduced sensing times and enhanced read and write performance.

8 Claims, 8 Drawing Sheets

U.S. PATENT DOCUMENTS

2003/0109093 A1* 6/2003 Harari et al. ............... 438/200
2003/0156454 A1* 8/2003 Wei et al. .............. 365/185.17
2004/0213045 A1* 10/2004 Nakai .................... 365/185.13

* cited by examiner

US 7,313,023 B2

PARTITION OF NON-VOLATILE MEMORY ARRAY TO REDUCE BIT LINE CAPACITANCE

FIELD OF THE INVENTION

This invention relates generally to non-volatile semiconductor memory such as electrically erasable programmable read-only memory (EEPROM) and flash EEPROM, and specifically ones having partitionable bit lines to reduce capacitance for improved reading and programming performance.

BACKGROUND OF THE INVENTION

Solid-state memory capable of non-volatile storage of charge, particularly in the form of EEPROM and flash EEPROM packaged as a small form factor card, has recently become the storage of choice in a variety of mobile and handheld devices, notably information appliances and consumer electronics products. Unlike RAM (random access memory) that is also solid-state memory, flash memory is non-volatile, retaining its stored data even after power is turned off. In spite of the higher cost, flash memory is increasingly being used in mass storage applications. Conventional mass storage, based on rotating magnetic medium such as hard drives and floppy disks, is unsuitable for the mobile and handheld environment. This is because disk drives tend to be bulky, are prone to mechanical failure and have high latency and high power requirements. These undesirable attributes make disk-based storage impractical in most mobile and portable applications. On the other hand, flash memory, both embedded and in the form of a removable card is ideally suited in the mobile and handheld environment because of its small size, low power consumption, high speed and high reliability features.

EEPROM and electrically programmable read-only memory (EPROM) are non-volatile memory that can be erased and have new data written or "programmed" into their memory cells. Both utilize a floating (unconnected) conductive gate, in a field effect transistor structure, positioned over a channel region in a semiconductor substrate, between source and drain regions. A control gate is then provided over the floating gate. The threshold voltage characteristic of the transistor is controlled by the amount of charge that is retained on the floating gate. That is, for a given level of charge on the floating gate, there is a corresponding voltage (threshold) that must be applied to the control gate before the transistor is turned "on" to permit conduction between its source and drain regions.

The floating gate can hold a range of charges and therefore can be programmed to any threshold voltage level within a threshold voltage window. The size of the threshold voltage window is delimited by the minimum and maximum threshold levels of the device, which in turn correspond to the range of the charges that can be programmed onto the floating gate. The threshold window generally depends on the memory device's characteristics, operating conditions and history. Each distinct, resolvable threshold voltage level range within the window may, in principle, be used to designate a definite memory state of the cell.

The transistor serving as a memory cell is typically programmed to a "programmed" state by one of two mechanisms. In "hot electron injection," a high voltage applied to the drain accelerates electrons across the substrate channel region. At the same time, a high voltage applied to the control gate pulls the hot electrons through a thin gate dielectric onto the floating gate. In "tunneling injection," a high voltage is applied to the control gate relative to the substrate. In this way, electrons are pulled from the substrate to the intervening floating gate.

The memory device may be erased by a number of mechanisms. For EPROM, the memory is bulk erasable by removing the charge from the floating gate by ultraviolet radiation. For EEPROM, a memory cell is electrically erasable, by applying a high voltage to the substrate relative to the control gate so as to induce electrons in the floating gate to tunnel through a thin oxide to the substrate channel region (i.e., Fowler-Nordheim tunneling). Typically, the EEPROM is erasable byte by byte. For flash EEPROM, the memory is electrically erasable either all at once or one or more blocks at a time, where a block may consist of 512 bytes or more of memory.

The memory devices typically comprise one or more memory chips that may be mounted on a card. Each memory chip comprises an array of memory cells supported by peripheral circuits such as decoders and erase, write and read circuits. The more sophisticated memory devices also come with a controller that performs intelligent and higher level memory operations and interfacing. There are many commercially successful non-volatile solid-state memory devices being used today. These memory devices may employ different types of memory cells, each type having one or more charge storage unit.

FIG. 1 illustrates schematically a non-volatile memory cell in the form of an EEPROM cell. It has a charge storage unit in the form of a floating gate. An electrically erasable and programmable read-only memory (EEPROM) has a similar structure to EPROM, but additionally provides a mechanism for loading and removing charge electrically from its floating gate upon application of proper voltages without the need for exposure to UV radiation. Examples of such cells and methods of manufacturing them are given in U.S. Pat. No. 5,595,924.

FIG. 2 illustrates schematically a string of charge storage units organized into a NAND cell or string. A NAND cell 50 consists of a series of memory transistors M1, M2, . . . Mn (n=4, 8, 16 or higher) daisy-chained by their sources and drains. A pair of select transistors S1, S2 controls the memory transistors chain's connection to the external via the NAND cell's source terminal 54 and drain terminal 56. In a memory array, when the source select transistor S1 is turned on by the signal SGS, the source terminal is coupled to a source line. Similarly, when the drain select transistor S2 is turned on by the signal SGD, the drain terminal of the NAND cell is coupled to a bit line of the memory array. Each memory transistor in the chain has a charge storage unit to store a given amount of charge so as to represent an intended memory state. Between each source and drain of each memory transistor is a channel region. Voltage on a control gate on each memory transistor, such as 60, 62, . . . , 64 controls current conduction in the channel of the memory transistors M1, M2, . . . , Mn respectively. The select transistors S1, S2 provides control access to the NAND cell via its source terminal 54 and drain terminal 56 respectively and each is turned on by appropriate voltage to its control gate.

When an addressed memory transistor within a NAND cell is read or verified during programming, its control gate is supplied with an appropriate reference voltage. At the same time, the rest of the non-addressed memory transistors in the NAND cell 50 are fully turned on by application of a sufficient voltage $V_{PASS}$ on their control gates. In this way, a conductive path is effectively created from the source of the individual memory transistor to the source terminal 54 of the NAND cell and likewise for the drain of the individual memory transistor to the drain terminal 56 of the cell. Similarly during programming, the memory transistor to be programmed has its control gate supplied with a programming voltage $V_{PGM}$, while the other memory transistors in string have their control gate supplied with the pass voltage $V_{PASS}$. Memory devices with such NAND cell structures are described in U.S. Pat. Nos. 5,570,315, 5,903,495 and 6,046,935.

Another similar non-volatile memory has each of its charge storage units in the form of a dielectric layer. Instead of the conductive floating gate elements described earlier, a dielectric layer is used. Such memory devices utilizing dielectric storage element have been described by Eitan et al., "NROM: A Novel Localized Trapping, 2-Bit Non-volatile Memory Cell," IEEE Electron Device Letters, vol. 21, no. 11, November 2000, pp. 543-545. An ONO dielectric layer extends across the channel between source and drain diffusions. The charge for one data bit is localized in the dielectric layer adjacent to the drain, and the charge for the other data bit is localized in the dielectric layer adjacent to the source. For example, U.S. Pat. Nos. 5,768,192 and 6,011,725 disclose a non-volatile memory cell having a trapping dielectric sandwiched between two silicon dioxide layers. Multi-state data storage is implemented by separately reading the binary states of the spatially separated charge storage regions within the dielectric.

Memory Array

A memory device typically comprises of a two-dimensional array of memory cells arranged in rows and columns and addressable by word lines and bit lines.

FIG. 3 illustrates an example of an array of NAND cells, such as that shown in FIG. 2. Along each column of NAND cells, a bit line 36 is coupled to the drain terminal 56 of each NAND cell. Along each row of NAND cells, a source line 34 may connect all their source terminals 54. Also the control gates 60, ..., 64 of the NAND cells along a row are connected to a series of corresponding word lines. An entire row of NAND cells can be addressed by turning on the pair of select transistors (see FIG. 2) with appropriate voltages on their control gates SGD and SGS via the connected word lines. When a memory transistor within the chain of a NAND cell is being read, the remaining memory transistors in the chain are turned on hard via their associated word lines so that the current flowing through the chain is essentially dependent upon the level of charge stored in the cell being read. An example of a NAND architecture array and its operation as part of a memory system is found in U.S. Pat. Nos. 5,570,315, 5,774,397 and 6,046,935.

Block Erase

Programming of charge storage memory devices can only result in adding more charge to its charge storage elements. Therefore, prior to a program operation, existing charge in a charge storage element must be removed (or erased). Erase circuits (not shown) are provided to erase one or more blocks of memory cells. A non-volatile memory such as EEPROM is referred to as a "Flash" EEPROM when an entire array of cells, or significant groups of cells of the array, is electrically erased together (i.e., in a flash). Once erased, the group of cells can then be reprogrammed. The group of cells erasable together may consist of one or more addressable erase unit. The erase unit or block typically stores one or more pages of data, the page being the unit of programming and reading, although more than one page may be programmed or read in a single operation. Each page typically stores one or more erase blocks of data, the size of the erase block being defined by the host system. An example is an erase block of 512 bytes of user data, following a standard established with magnetic disk drives, plus some number of bytes of overhead information about the user data and/or the block in with it is stored. In other systems, the erase block size can be much larger than 512 bytes.

Read/Write Circuits

In the usual two-state EEPROM cell, at least one current breakpoint level is established so as to partition the conduction window into two regions. When a cell is read by applying predetermined, fixed voltages, its source/drain current is resolved into a memory state by comparing with the breakpoint level (or reference current $I_{REF}$) If the current read is higher than that of the breakpoint level or $I_{REF}$, the cell is determined to be in one logical state (e.g., a "zero" state). On the other hand, if the current is less than that of the breakpoint level, the cell is determined to be in the other logical state (e.g., a "one" state). Thus, such a two-state cell stores one bit of digital information. A reference current source, which may be externally programmable, is often provided as part of a memory system to generate the breakpoint level current.

In order to increase memory capacity, flash EEPROM devices are being fabricated with higher and higher density as the state of the semiconductor technology advances. Another method for increasing storage capacity is to have each memory cell store more than two states.

For a multi-state or multi-level EEPROM memory cell, the conduction window is partitioned into more than two regions by more than one breakpoint such that each cell is capable of storing more than one bit of data. The information that a given EEPROM array can store is thus increased with the number of states that each cell can store. EEPROM or flash EEPROM with multi-state or multi-level memory cells have been described in U.S. Pat. No. 5,172,338.

In practice, the memory state of a cell is usually read by sensing the conduction current across the source and drain electrodes of the cell when a reference voltage is applied to the control gate. Thus, for each given charge on the floating gate of a cell, a corresponding conduction current with respect to a fixed reference control gate voltage may be detected. Similarly, the range of charge programmable onto the floating gate defines a corresponding threshold voltage window or a corresponding conduction current window.

Alternatively, instead of detecting the conduction current among a partitioned current window, it is possible to set the threshold voltage for a given memory state under test at the control gate and detect if the conduction current is lower or higher than a threshold current. In one implementation, the detection of the conduction current relative to a threshold current is accomplished by examining the rate the conduction current is discharging through the capacitance of the bit line.

Factors Affecting Read/Write Performance and Accuracy

One factor affecting read and write performance is bit line capacitance. As memory arrays get bigger in order to reduce total die size, bit lines become longer. Also, with ever increasing density, memory transistors, and consequently their corresponding bit lines, are formed closer and closer together. Both of these factors increase bit line capacitance, which in turn increases both sensing time and power consumption dramatically. To accommodate this problem, the sensing time must be increased.

One technique introduced in the prior art to ameliorate this effect is to break the bit line into a number of local bit line segments that only run over a corresponding segment of the array. These local bit line segments can then selectively be connected to a global bit line or metal line that spans the entire array. Such a structure is described, for example, in U.S. Pat. No. 5,315,541. Although such an approach goes some way towards reducing the problem, it still requires all of the global bit lines.

Therefore there is a general need for high performance and high capacity non-volatile memory. In particular, there is a need to have a high capacity non-volatile memory with improved read and program performance that effectively manages the aforementioned problems.

SUMMARY OF INVENTION

These needs for a high capacity and high performance non-volatile memory device are met by a principle aspect of the present invention that partitions the memory array in N segments by switchably partitioning the bit lines in the array. In the exemplary embodiment, a top set of sense amps control the even bit lines and a bottom set of sense amps control the odd bit lines. The segmentation transistors turn on or off depending on the selected word line location in the array. Since bit line capacitance is mainly from the metal bit line to bit line coupling to their immediate neighbors, the bit line neighbors in the partitioned array are floating in some segments of the bit lines. The overall bit line capacitance is significantly reduced with a negligible increase in die size, resulting in reduced sensing times and enhanced read and write performance.

According to a first set of embodiments, the array is partitioned into a number of sections by introducing a partition switch along each of the bit lines between each pair of adjacent array partitions. In each set of partitioning switches, the odd and even bit line switches are respectively controlled by odd and even select lines. In this way, adjacent bit lines are concurrently active only with the segment of the array selected for access. In the other segments, the active bit lines are separated by non-active, floating bit lines.

According to another set of embodiments, the array is again partitioned into a number of sections by introducing a partition switch along each of the bit lines between each pair of adjacent array partitions, but by alternating the odd and even bit line partition switches. In each set of partitioning switches, either the odd or the even bit line switches are controlled by a select line.

Additional features and advantages of the present invention will be understood from the following description of its preferred embodiments, which description should be taken in conjunction with the accompanying drawings.

DETAILED DESCRIPTION OF THE PREFERRED EMBODIMENTS

All Bit Line Programming

Figure 4A:
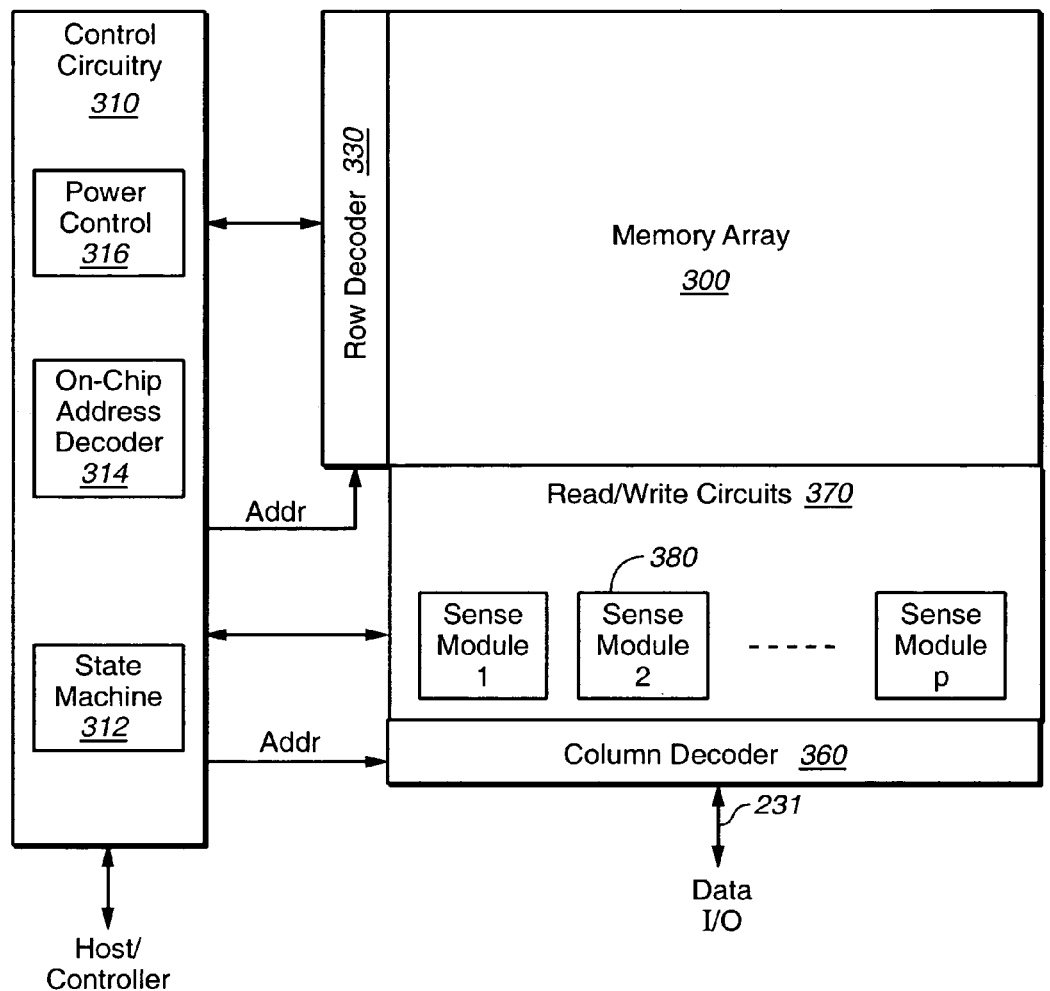
FIG. 4A illustrates schematically a memory device having read/write circuits for reading and programming a page of memory cells in parallel, according to one embodiment of the present invention.
Figure 4B:
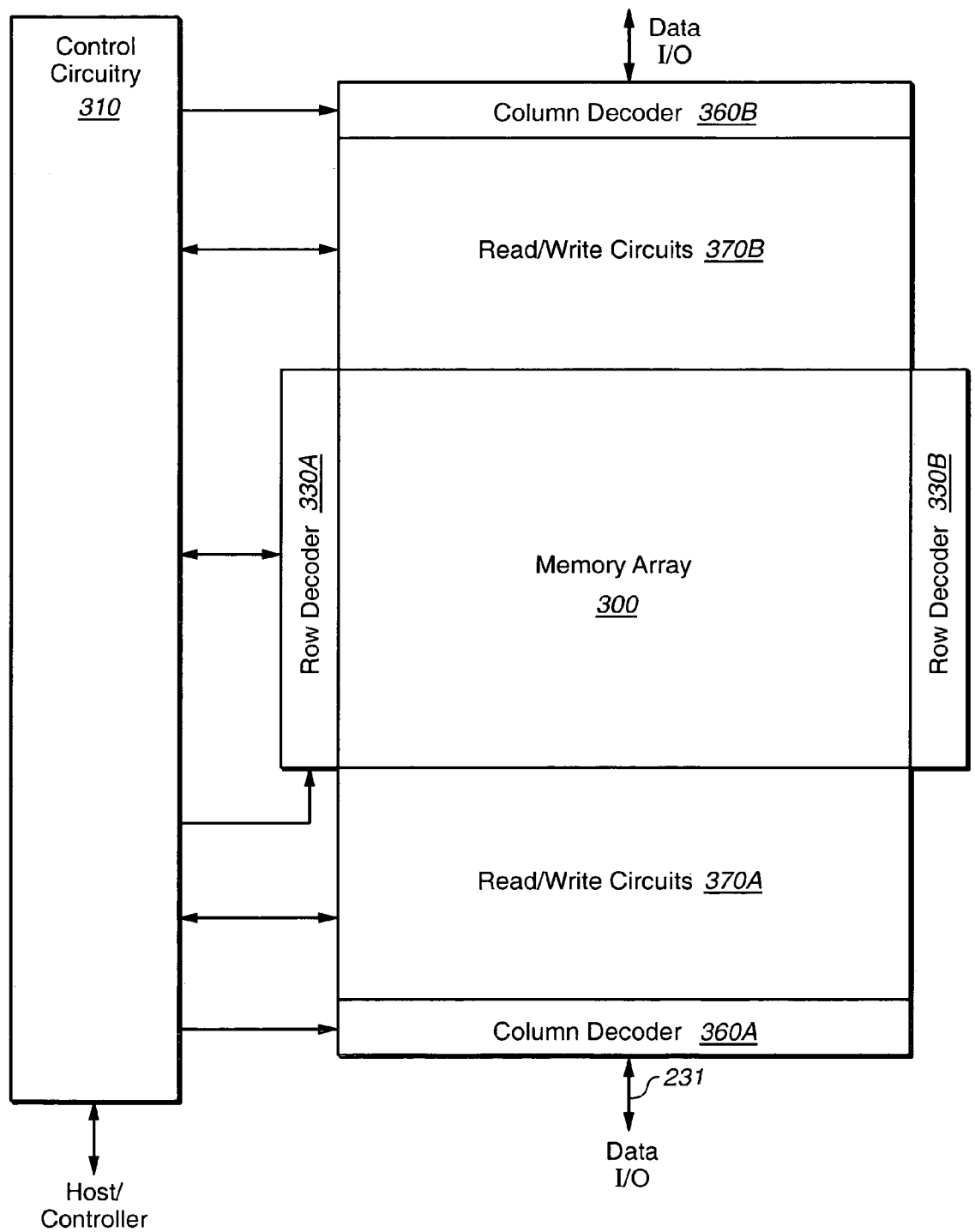
FIG. 4B illustrates a preferred arrangement of the memory device shown in FIG. 4A.

The sense module 380 shown in FIG. 4A and FIG. 4B is preferably implemented in a memory architecture configured to perform all-bit-line sensing. In other words, contiguous memory cells in a row are each connectable to a sense module to perform sensing in parallel. Such a memory architecture is also disclosed in co-pending and commonly assigned U.S. patent application Ser. No. 10/254,483 filed by Cernea et al., on Sep. 24, 2002 entitled, "Highly Compact Non-Volatile Memory And Method Thereof." The entire disclosure of said patent application is hereby incorporated herein by reference.

As described earlier, the number of memory cells in a "page" that are programmed or read simultaneously may vary according to the size of data sent or requested by a host system. Thus, there are several ways to program the memory cells coupled to a single word line, such as (1) programming even bit lines and odd bit lines separately, which may comprise upper page programming and lower page programming, (2) programming all the bit lines ("all-bit-line programming"), or (3) programming all the bit lines in a left or right page separately, which may comprise right page programming and a left page.

FIG. 4A illustrates schematically a memory device having read/write circuits for reading and programming a page of memory cells in parallel, according to one embodiment of the present invention. The memory device includes a two-dimensional array of memory cells 300, control circuitry 310, and read/write circuits 370. The memory array 300 is addressable by word lines via a row decoder 330 and by bit lines via a column decoder 360. The read/write circuits 370 include multiple sense modules 380 and allow a page of memory cells to be read or programmed in parallel.

In the present invention, the page of memory cells to be read or programmed in parallel is preferably a row of contiguous memory storage cells or storage units. In other embodiments, the page is a segment of a row of contiguous memory storage cells or storage units.

The control circuitry 310 cooperates with the read/write circuits 370 to perform memory operations on the memory array 300. The control circuitry 310 includes a state machine 312, an on-chip address decoder 314 and a power control module 316. The state machine 312 provides chip level control of memory operations. The on-chip address decoder 314 provides an address interface between that used by the host or a memory controller to the hardware address used by the decoders 330 and 370. The power control module 316 controls the power and voltages supplied to the word lines and bit lines during memory operations.

FIG. 4B illustrates a preferred arrangement of the memory device shown in FIG. 4A. Access to the memory array 300 by the various peripheral circuits is implemented in a symmetric fashion, on opposite sides of the array so that the densities of access lines and circuitry on each side are reduced in half. Thus, the row decoder is split into row decoders 330A and 330B and the column decoder into column decoders 360A and 360B. Similarly, the read/write circuits are split into read/write circuits 370A connecting to bit lines from the bottom and read/write circuits 370B connecting to bit lines from the top of the array 300. In this way, the density of the read/write modules, and therefore that of the sense modules 380, is essentially reduced by one half. Various aspects of all bit line programming are developed further in U.S. patent application Ser. No. 10/667,222 filed Sep. 17, 2003.

Partitionable Bit Lines

Figure 5B:
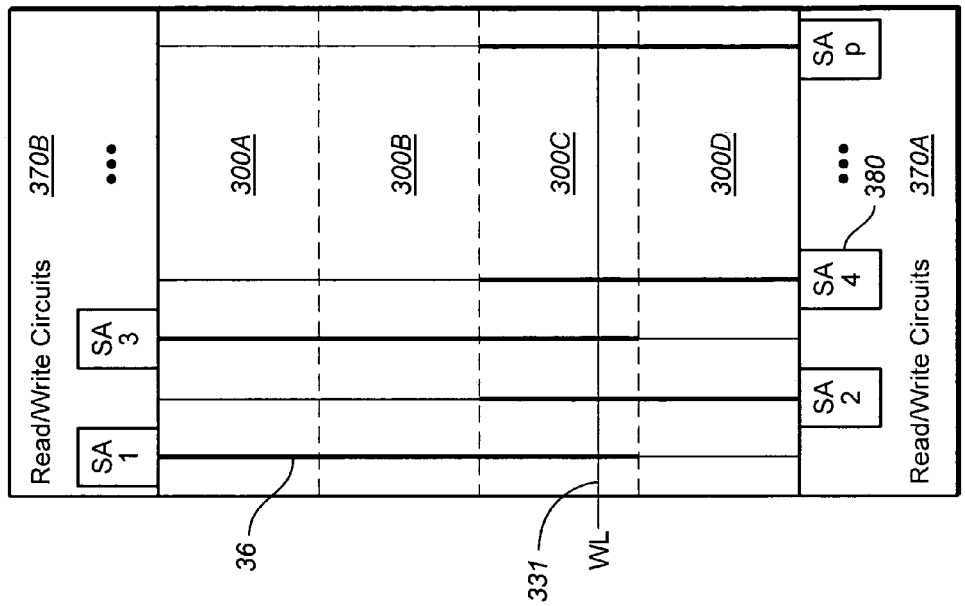
FIG. 5B schematically illustrates a first embodiment of the present invention.
Figure 5A:
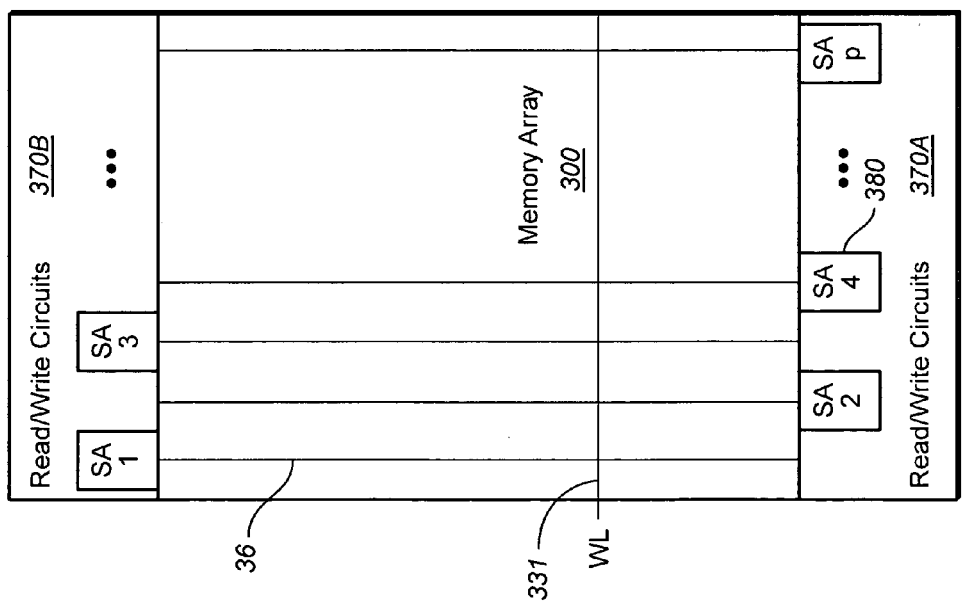
FIG. 5A shows some elements of a particular embodiment of FIG. 4B in further detail.

To illustrate aspects of the present invention, FIG. 5A shows some elements of a particular embodiment of FIG. 4B in further detail. A set of p bit lines 36 span the entire array 300 for the use of all of the memory storage units in the corresponding column, and are each connectable to a corresponding sense module 380 SA1-SAp, the sense modules for the even numbered bit lines placed along the bottom of the array and those of the odd numbered bit lines at the top. A single word line WL 331, corresponding to a row of cells to be read, is shown. To sense the memory cells along word line requires the entirety of each bit line be charged. As arrays become larger and denser, both the number and length of bit line increase and the distance between adjacent bit lines decreases. All of these increase the resultant amount of bit line capacitance, with a corresponding increase in sensing time and power consumption. This effect is more pronounced when the adjacent bit lines are both active.

If it were possible to disconnect the portion of the bit lines on the far side of the word line 331 from the corresponding sense circuit (above WL 331 for even bit lines and below WL 331 for the odd bit lines), while still able to connect the lower portion of the bit lines to their corresponding sense amp, this problem could be significantly reduced, particularly for those word lines nearer the sense amp. According to a principle aspect of the present invention, a number of switches are introduced along the bit lines allowing them to be selectively segmented. FIG. 5B schematically illustrates this.

As shown in FIG. 5B, the array 300 is subdivided into four regions, 300A-D, as indicated by the broken lines, by having switches placed along each bit line between the regions. For instance, bit line 36 will have a switch at the broken line between each array subdivision, allowing the portion not being used to be disconnected from the sense circuit. For example, if the selected word line is WL 331 in section 330C, the odd bit lines can be turned off in the bottom section (330D) and the even bit lines turned off in the top half of the array (300A, 300B). This is illustrated in FIG. 5B schematically by having the active portions of each bit line shown heavy than the disconnected portion, which is left to float. In this way, the system saves on having to charge up the entire length of all of the bit lines being used and, what is generally more significant, adjacent bit lines are concurrently active in only a single of the sections. In the shown arrangement of four sectors, three switches per bit line (at the crossing of the broken line) are introduced. More generally, to subdivide the array into N portions uses (N−1) such switches along each bit line.

The arrangement of FIG. 5B is just one embodiment, based on the sense circuits being split between the top and bottom of the array, using a all bit line read technique, and using metal global bit lines spanning the array. More generally, the use of segmental bit lines can used in other arrangements, such as when all of the sensing circuitry is on one side of the array, each sense module is multiplexed for use with multiple bit lines, or both. Additionally, it is not limited to global bit lines, but may also be used for local bit lines, or either or both the global and local bit lines in arrangements such as that of U.S. Pat. No. 5,315,541, where a number of local bit line segments are connectable to a global metal or other bit line.

Figure 6:
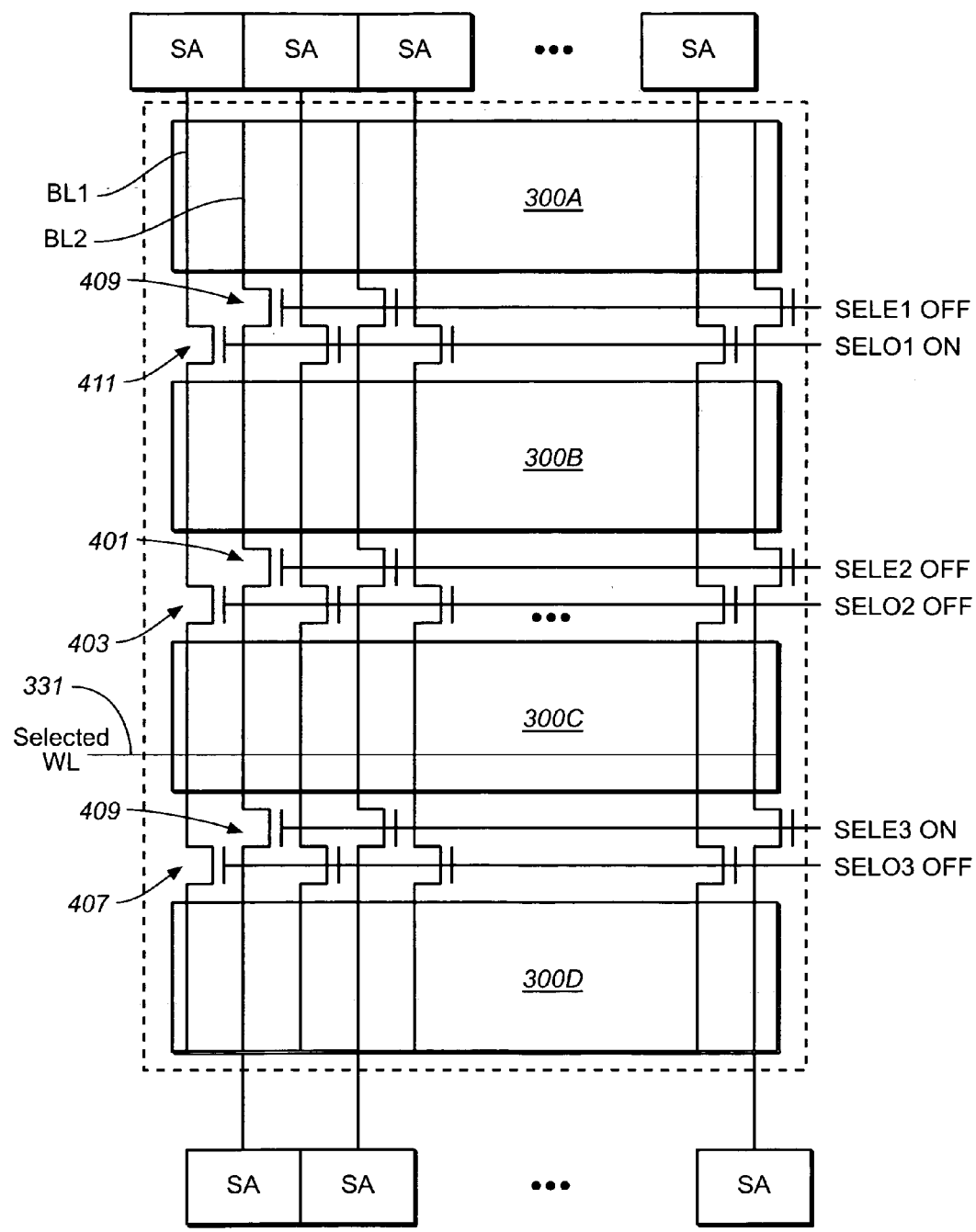
FIG. 6 shows some detail of a specific implementation of the embodiment of FIG. 5B.

FIG. 6 is similar to FIG. 5B, but with the switches explicitly shown, here implemented as NMOS transistors, although other implementations can be used as will be understood by those familiar with the art. Taking BL1 and BL2 as representatives of the odd and even bit lines, the transistors are turned on by the odd and even select lines, respectively SELOi and SELEi. To allow access to array portion 300C containing the selected word line WL, transistors 403 and 411 are turned on and transistor 407 is turned off, allowing the portion of BL1 in section 300D to float. Similarly, to allow the corresponding lower sense on BL2 to access word line WL, transistor 405 is turned on, while transistor 401 and, in this embodiment, 409 are turned off, allowing the top half of BL2 to float.

Figure 1:
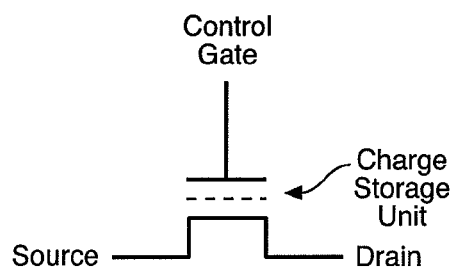
FIG. 1 illustrates schematically a non-volatile memory cell in the form of an EEPROM cell.
Figure 2:
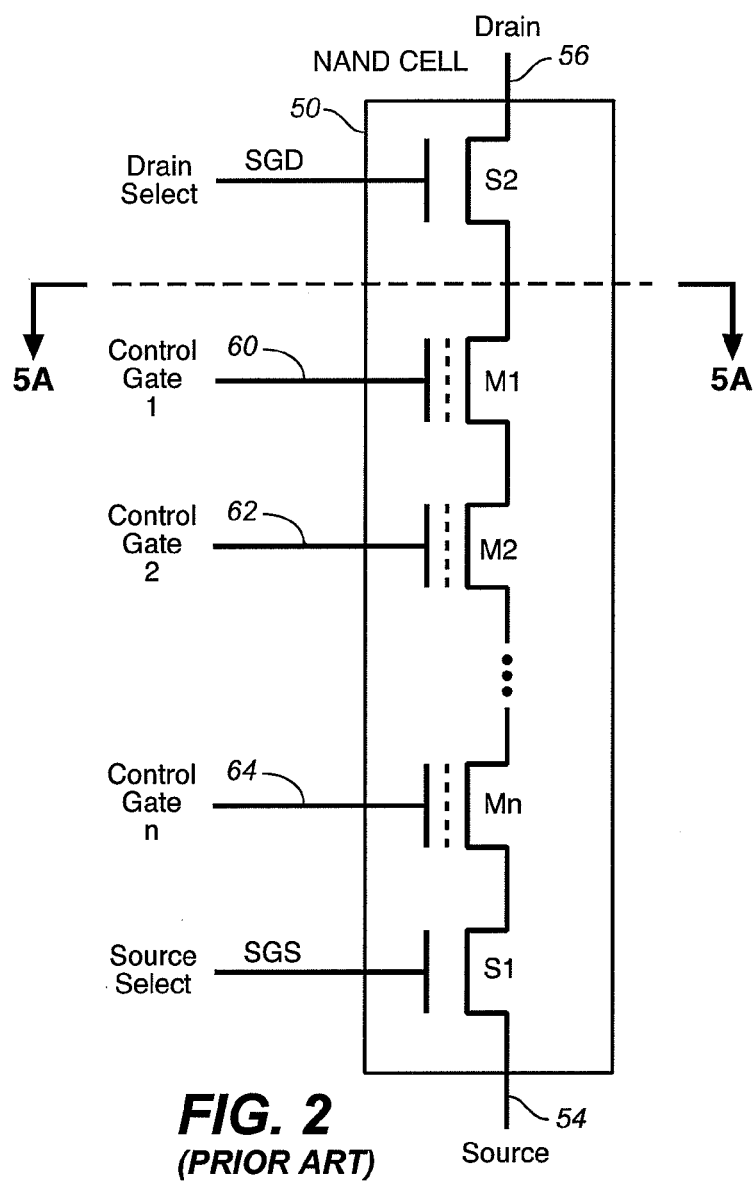
FIG. 2 illustrates schematically a string of charge storage units organized into a NAND cell or string.
Figure 3:
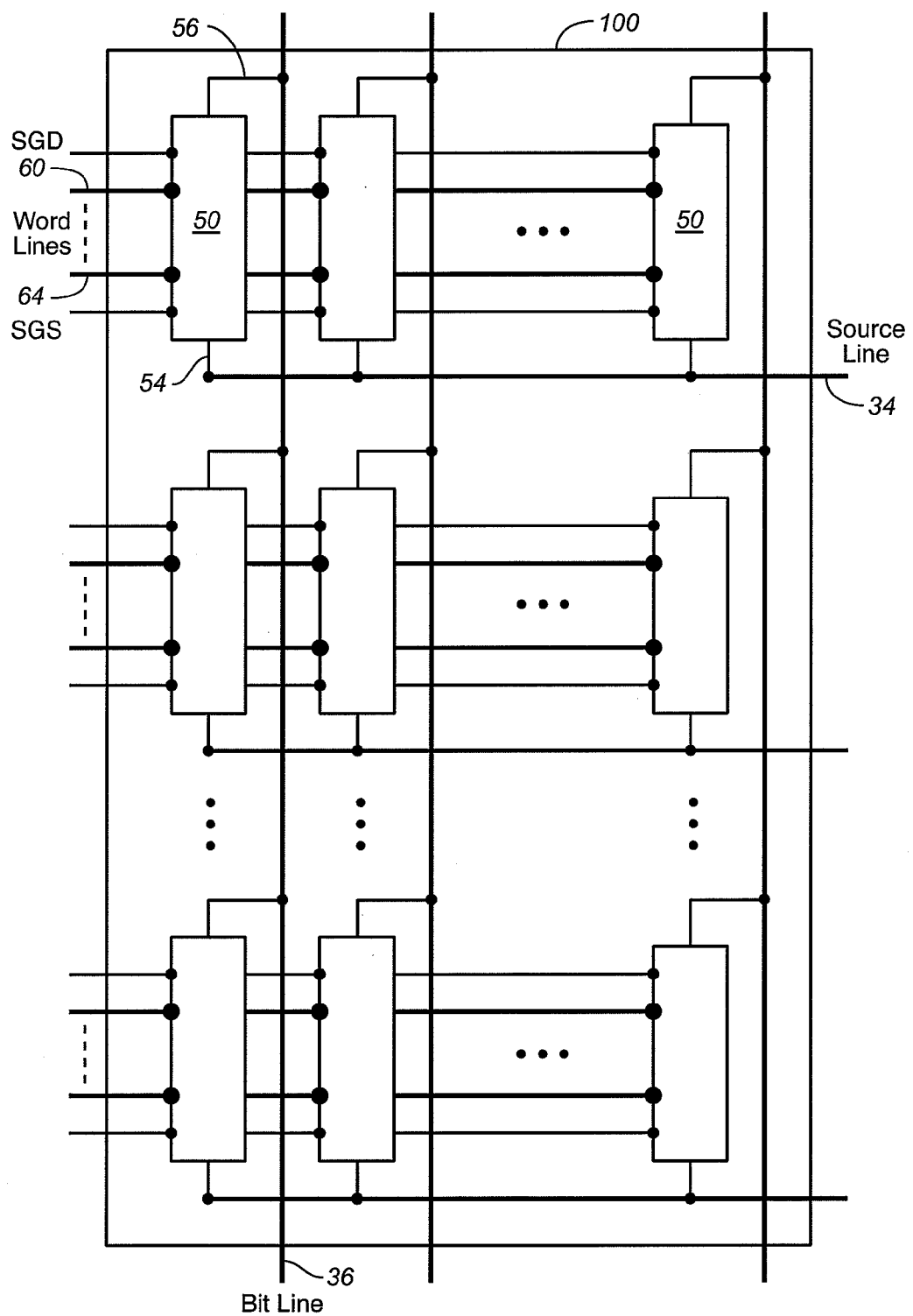
FIG. 3 illustrates an example of an array of NAND cells, such as that shown in FIG. 2.

The details of the array segments 300A-D are not shown explicitly, but may be of any of the standard architectures. For example, in one preferred embodiment, the memory array 300 uses a NAND architecture such as that described above with respect to FIGS. 2 and 3, where each column of the array is formed from a number of NAND strings. The bit lines of FIG. 6 are then the global, metal bit lines such as 36 in FIG. 3 and each segmented portion of the array between the segmentation switches will have the structure shown in FIG. 3. (Similar remarks apply to the array 500 and its subdivisions 500A-G described below with respect to FIG. 8).

FIG. 6 is not meant to be to scale, but only schematic. In actuality, the increase in array size that the introduction of these switches causes is largely negligible, as it only adds the three transistors on each bit line and corresponding three even and three odd select lines, and the corresponding control circuitry is readily implemented in row decoder 330. More generally, to split the array into N portions under the arrangement of FIG. 6 introduces (N−1) transistors on each of the odd and even bit lines along with the corresponding 2N−2 select lines. Given the size and corresponding number of transistors and row lines in a typical array, the increase in size for any reasonable value of N is minimal.

As discussed above, BL capacitance is greatest when adjacent bit lines are active. In the arrangement of FIGS. 5B and 6, only one segment of the array (that with the selected word line WL 331, here 300 C) will have adjacent bit lines concurrently active. This reduces the full contribution from adjacent active to only (1/N)th of what it was before. In other segments of the array each active bit line will have a floating, non-active bit line between itself and the nearest active bit line. For instance, in FIG. 5B, in any segment other than 300C, the bit line connected to SA3 will be buffered from the nearest active bit line on either side by the floating bits connected to SA2 and SA4. The bit line capacitance of the active bit lines in these non-selected segments of the array is not completely eliminated, but a significant fraction thereof is.

The remaining capacitance in these other segments is primarily due to several sources: a) the direct capacitance between a given active bit line and the substrate; the capacitance between a given active bit line and the active bit lines two bit lines over, either through b) their direct coupling or c) indirect coupling through the intermediate inactive bit line; and d) the capacitance between a given active bit line and the non-active adjacent bit lines itself. It is the last two of these, c) and d), that are noticeably reduced in the present invention. This is described in more detail with respect to FIG. 7.

Figure 7:
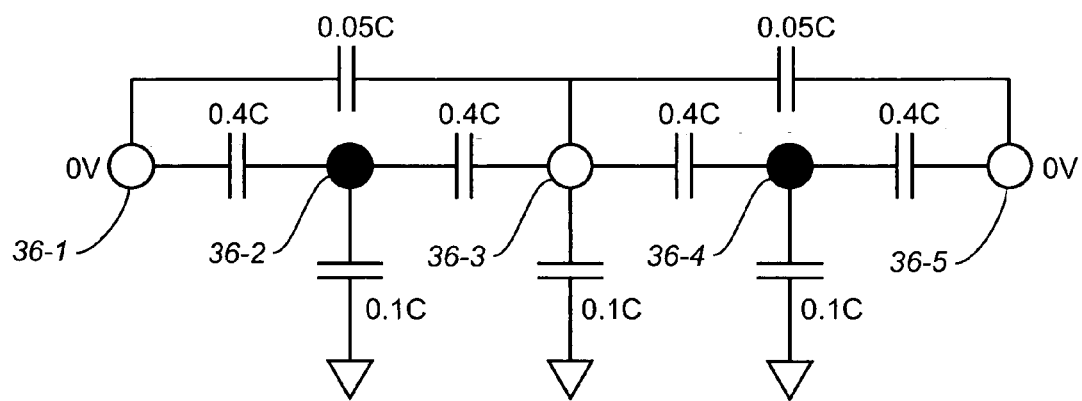
FIG. 7 shows various contributions to the capacitance of a bit line.

In general, the present invention has two kinds of memory array segments. In the first sort, such as 300C in FIG. 6 or 500D in FIG. 8 below, neighboring bit lines are active and the bit line capacitance of a bit line segment in this case can be taken as C. For the second case, where the neighboring bit lines are floating, FIG. 7 shows various contributions to the capacitance of a bit line. In FIG. 7 the open circles (36-1, 36-3, 36-5) represent active nodes and the dark circles (36-2, 36-4) are the floating nodes. The main contributions to the center, active node 36-3 is composed of the elements described in the last paragraph. (The rest of the array's bit lines are suppressed in FIG. 7 to simplify the discussion.) The values shown in FIG. 7 are reasonable estimates for the contributions. The first contribution is between node 36-3 and substrate and is shown with a value of 0.1 C. A second contribution is to the neighboring, floating bit line 36-2 and consists of the 0.4 C coupling between 36-2 in series with the 0.1 C coupling of 36-1 to the substrate and the 0.4C coupling of 36-2 to 36-1, adding up to a contribution of 0.22C. By symmetry, the coupling to 36-4 will contribute the same as to 36-2. The coupling to the active bit lines 36-1 and 36-5 each contribute 0.05C. Adding up these contributions, in the segments where the alternate bit lines are left to float, the values is (0.1+(2×0.22)+(2×0.05))=0.64C.

Thus, in all but the selected sector, the capacitance is reduced to less than two thirds of the value it would have otherwise.

Figure 8:
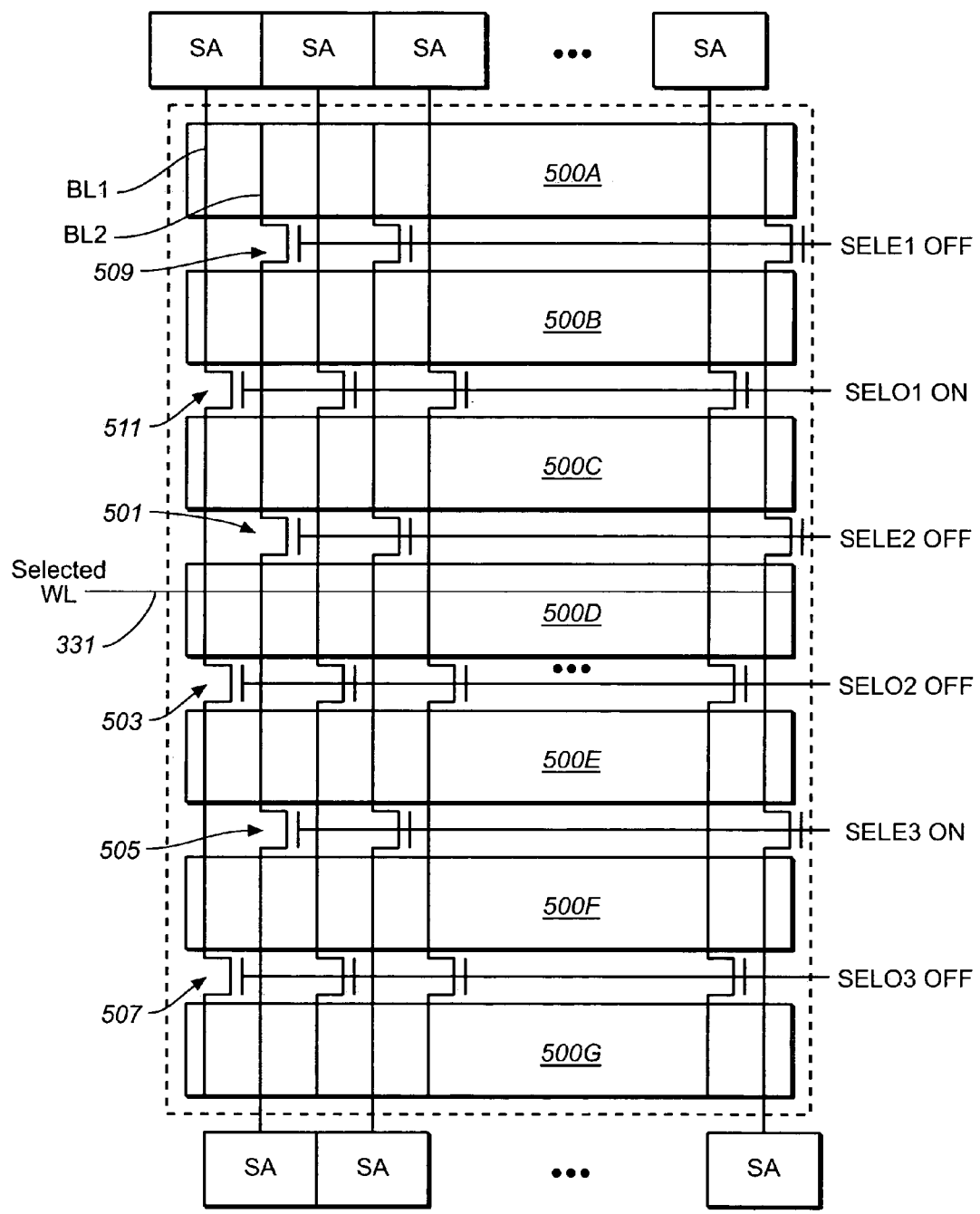
FIG. 8 shows one implementation of a second embodiment of the present invention.

FIG. 8 shows a second embodiment again having (N−1) segmentation transistors on each (here) global metal bit line, but now with the odd bit line (e.g. BL1) segmentation transistors (503, 507, 511) and even bit line (e.g. BL2) segmentation transistors (501, 505, 509) located separately. The various generalizations discussed with respect to the preceding embodiment also apply here. The embodiment of FIG. 8 results in a subdivision of the array into 2N−1 portions, here the seven divisions 500A-G, with only a single segmentation select line between each one. The segmentation selection lines for the even bit lines (SELEi) alternate with those of the odd bit lines (SELOi). For instance, if the selected word line WL 331 lies in array segment 500D, the odd select lines above this segment (SELO1) are on, while those below (SELO2 and SELO3) are off; conversely, the even select lines below this segment (SELE3) are on, while those above (SELE2 and SELE1) are off. Consequently, only in array segment 500D containing the selected word line will have adjacent bit lines active.

As the embodiment of FIG. 8 adds the same number of transistors and select lines as the embodiment of FIGS. 5B and 6, the corresponding increase in array size relative to a non-segmented array is essentially the same. As can be seen by comparing these figures, each of these exemplary embodiments adds the same number of transistors ((N−1) (=3 here)) along each bit line and 2(N−1) (=6 here) select lines; however, in FIG. 8 this results in the segmentation of the array into (2N−1) (=7 here) portions, instead of the N portions of FIG. 6. Thus, an even smaller section of the array will have neighboring bit lines active, further decreasing bit line capacitance.

As mentioned above, the discussion so far has referred mainly to embodiments based on flash EEPROM memory cells and have been described with respect to the type of cell that utilizes conductive floating gates as charge storage elements. However, the various aspects of the present invention can be used in conjunction with the various alternate non-volatile memory technologies (such as thin film, MRAM, FRAM, NMOS, etc.) described in U.S. patent application Ser. No. 10/841,379 filed May 7, 2004. For example, the invention may also be implemented in a system that uses a charge trapping dielectric as the storage elements in individual memory cells in place of floating gates. Dielectric storage elements are also discussed further in the U.S. patent application Ser. No. 10/280,352, filed Oct. 25, 2002.

The patents, patent applications, articles and book portions identified above are all hereby expressly incorporated in their entirety into this document by these references. Although the various aspects of the present invention have been described with respect to certain embodiments, it is understood that the invention is entitled to protection within the full scope of the appended claims.

The invention claimed is:

1. A non-volatile memory comprising:
    an array of memory storage units formed into a plurality of columns;
    a plurality of bit lines corresponding to each of the columns, wherein the memory storage units of a given column are connectable to the corresponding bit line;
    a plurality of sense circuits each connectable to one or more bit lines whereby the data content of memory storage units connected to a corresponding connected bit line can be sensed; and
    at least one switch formed on each of said bit lines for the partition thereof into a first portion that remains connectable to the corresponding sense circuit and second portion not connectable to the corresponding sense circuit,
    wherein the bit lines are orderable as alternating odd and even bit lines, the sense circuits connectable to the odd bit lines formed along a first side of the array and the sense circuits connectable to the even bit lines formed along the side of the array opposite to the first side, wherein said switches partition the array into a plurality of segment, and wherein between each pair of adjacent segments of the array are situated in an alternating manner one of either a switch on each of said even bits lines controlled by a common select line or a switch on each of said odd bits lines controlled by a common select line.

2. The non-volatile memory of claim 1, wherein said bit lines are global bit lines.

3. The non-volatile memory of claim 2, wherein said columns are each composed of a plurality of strings of memory cells having a NAND type architecture, each of the strings connectable to the corresponding global bit line.

4. The non-volatile memory of claim 1, wherein said bit lines are implemented in metal.

5. The non-volatile memory of claim 1, wherein said switches are implemented as transistors.

6. The non-volatile memory of claim 1, wherein said switches partition the array into a plurality of segments.

7. A method of operating a non-volatile memory array, comprising:
    selecting a word line to access;
    determining to which of a plurality of array partitions the selected word line belongs; and floating alternate bit lines in one or more of the array partitions other than that to which the selected word line belongs, wherein said floating alternate bit lines comprises:
  setting one of either a switch value on the odd bit lines or a switch value on the even bit lines between each of said partitions.

8. A non-volatile memory of comprising:
an array of memory storage units formed into a plurality of columns and rows;
a plurality of bit lines corresponding to each of the columns, wherein the memory storage units of a given column are connectable to the corresponding bit line;
a plurality of sense circuits each connectable to one or more bit lines whereby the data content of memory storage units connected to a corresponding connected bit line can be sensed;
a plurality of word lines corresponding to each of the rows; and
circuitry to selectively partition said bit lines, whereby alternate bit lines in one or more of the array partitions other than that to which the selected word line belongs can be floated, wherein the circuitry to selectively partition said bit lines includes at least one switch formed on each of either the even ones of said bit lines or the odd ones of said bit lines and bit line in those portions of the array partition other than that to which a selected word line belongs are floated by setting a switch value between each of said partitions on all of said bit lines.

* * * * *

UNITED STATES PATENT AND TRADEMARK OFFICE
CERTIFICATE OF CORRECTION

PATENT NO. : 7,313,023 B2  Page 1 of 1
APPLICATION NO. : 11/078173
DATED : December 25, 2007
INVENTOR(S) : Yan Li and Farookh Moogat It is certified that error appears in the above-identified patent and that said Letters Patent is hereby corrected as shown below:

Column 10, line 44, claim 1, delete "segment," and insert --segments,--.

Signed and Sealed this

Sixth Day of May, 2008

JON W. DUDAS
*Director of the United States Patent and Trademark Office*